United States Patent
Dusija et al.

(10) Patent No.: US 9,058,881 B1
(45) Date of Patent: Jun. 16, 2015

(54) SYSTEMS AND METHODS FOR PARTIAL PAGE PROGRAMMING OF MULTI LEVEL CELLS

(71) Applicant: SanDisk Technologies Inc., Plano, TX (US)

(72) Inventors: Gautam A. Dusija, Milpitas, CA (US); Chris Avila, Saratoga, CA (US); Deepak Raghu, Milpitas, CA (US); Yingda Dong, San Jose, CA (US); Man Mui, Fremont, CA (US); Alexander Kwok-Tung Mak, Los Altos Hills, CA (US); Pao-Ling Koh, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/097,523

(22) Filed: Dec. 5, 2013

(51) Int. Cl.
*G11C 11/34* (2006.01)
*G11C 16/10* (2006.01)
*G11C 16/26* (2006.01)

(52) U.S. Cl.
CPC ............... *G11C 16/10* (2013.01); *G11C 16/26* (2013.01)

(58) Field of Classification Search
CPC ............................ G11C 16/10; G11C 16/0483
USPC ........................................ 365/185.03, 185.24
See application file for complete search history.

(56) References Cited

U.S. PATENT DOCUMENTS

| | | | |
|---|---|---|---|
| 5,570,315 A | 10/1996 | Tanaka et al. | |
| 5,768,192 A | 6/1998 | Eitan | |
| 5,903,495 A | 5/1999 | Takeuchi et al. | |
| 5,923,587 A * | 7/1999 | Choi | 365/185.11 |
| 6,011,725 A | 1/2000 | Eitan | |
| 6,046,935 A | 4/2000 | Takeuchi et al. | |
| 6,297,988 B1 * | 10/2001 | Parker et al. | 365/185.03 |
| 7,057,939 B2 | 6/2006 | Li et al. | |
| 7,310,280 B2 * | 12/2007 | Park et al. | 365/210.1 |
| 7,719,889 B2 | 5/2010 | Lin | |
| 7,885,120 B2 * | 2/2011 | Hung et al. | 365/185.22 |
| 7,986,559 B2 * | 7/2011 | Lee et al. | 365/185.22 |
| 8,090,918 B2 * | 1/2012 | Fang et al. | 711/162 |
| 8,385,120 B2 * | 2/2013 | Jang et al. | 365/185.12 |
| 8,514,625 B2 * | 8/2013 | Shim et al. | 365/185.18 |
| 8,792,263 B2 * | 7/2014 | Tanzawa | 365/72 |
| 2010/0188903 A1 * | 7/2010 | Lee et al. | 365/185.22 |
| 2012/0140557 A1 * | 6/2012 | Park et al. | 365/185.02 |
| 2012/0155166 A1 | 6/2012 | Li | |
| 2012/0166582 A1 * | 6/2012 | Binder | 709/217 |
| 2012/0206978 A1 | 8/2012 | Taso et al. | |
| 2012/0220088 A1 | 8/2012 | Alsmeier | |
| 2012/0311244 A1 | 12/2012 | Huang et al. | |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
U.S. Appl. No. 13/788,415 entitled "Write Sequence Providing Write Abort Protection," filed Mar. 7, 2013, 36 pages.

(Continued)

*Primary Examiner* — Michael Tran
(74) *Attorney, Agent, or Firm* — Davis Wright Tremaine LLP

(57) ABSTRACT

Multiple bits of data are programmed together to each cell of a segment of a word line while other segments of the same word line are unprogrammed. Subsequently, additional segments are similarly programmed. Data is read from a partially programmed word line (with a mix of programmed and unprogrammed segments) using a single reading scheme.

21 Claims, 14 Drawing Sheets

| | Segment 1 | Segment 2 | Segment 3 | Segment 4 |
|---|---|---|---|---|
| UP | 2 | 4 | | |
| LP | 1 | 3 | | |

(56) References Cited

U.S. PATENT DOCUMENTS

| | | | |
|---|---|---|---|
| 2013/0028018 A1* | 1/2013 | Cho et al. | 365/185.03 |
| 2013/0107628 A1 | 5/2013 | Dong et al. | |
| 2013/0148400 A1* | 6/2013 | Murooka | 365/63 |
| 2013/0173845 A1 | 7/2013 | Aslam et al. | |
| 2013/0201760 A1 | 8/2013 | Dong et al. | |
| 2013/0258772 A1* | 10/2013 | Lee et al. | 365/185.03 |
| 2014/0056066 A1* | 2/2014 | Baum et al. | 365/185.03 |

OTHER PUBLICATIONS

U.S. Appl. No. 13/933,987 entitled "Write Operations with Full Sequence Programming for Defect Management in Nonvolatile Memory," filed Jul. 2, 2013, 49 pages.

Office Action for U.S. Appl. No. 14/284,708 mailed Jul. 17, 2014, 14 pages.

Notice of Allowance and Fees Due for U.S. Appl. No. 14/284,708 mailed Dec. 23, 2014, 6 pages.

* cited by examiner

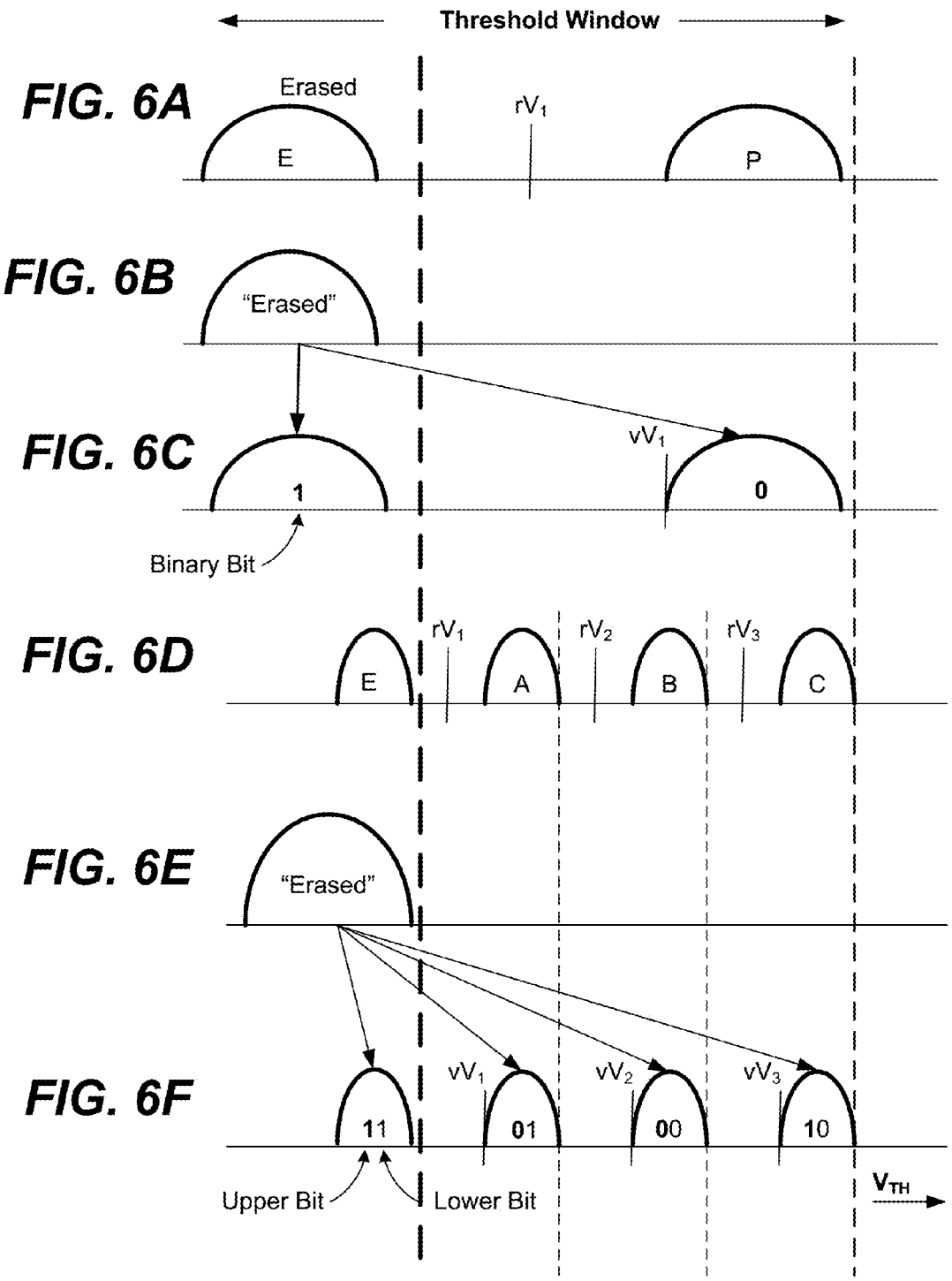

Multistate Memory

Lower Page Programming (2-bit Code)

Upper Page Programming (2-bit Code)

Lower Page Read (2-bit Code)

Upper Page Read (2-bit Code)

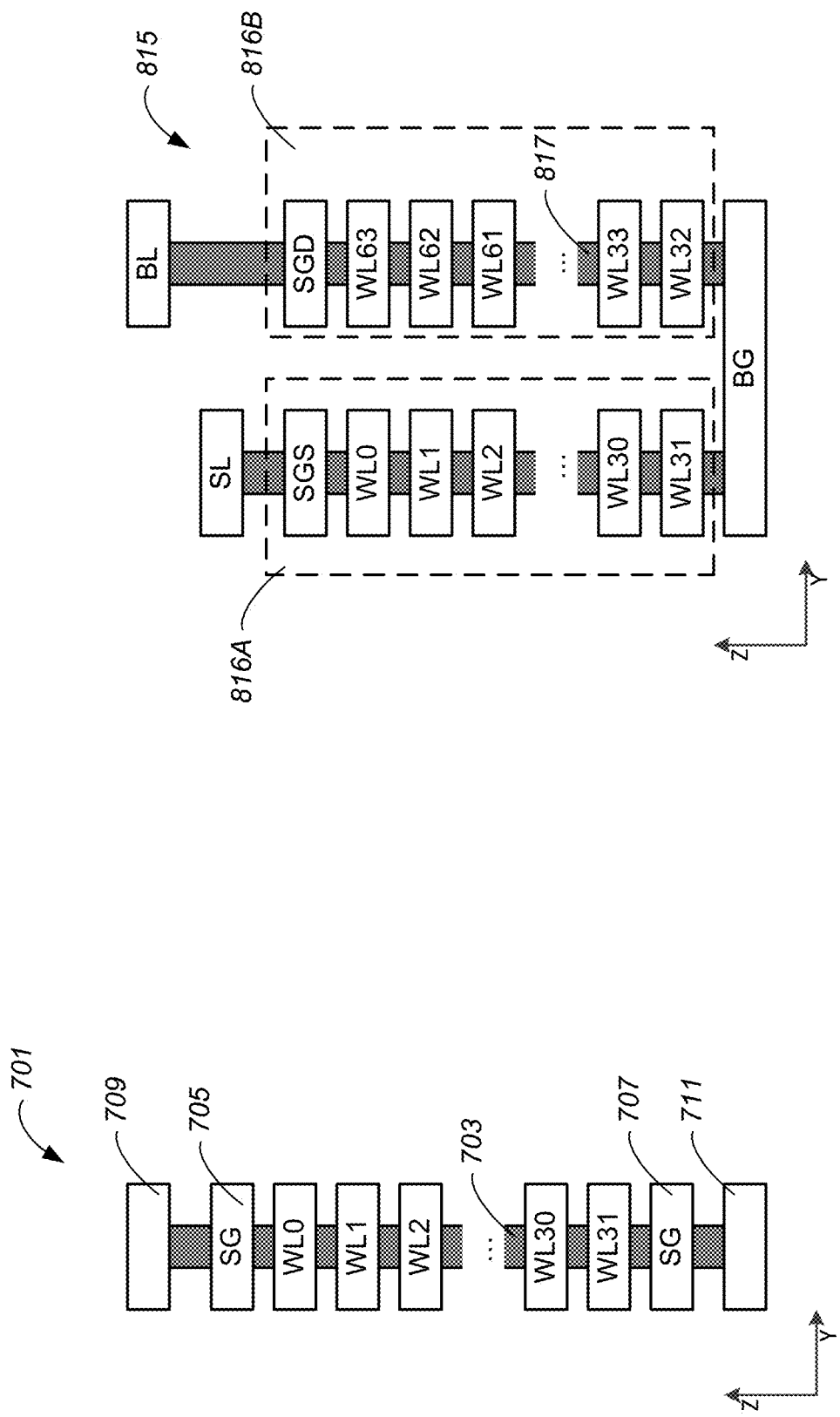

|     | LP | UP |
|-----|----|----|
| WL0 | 0  | 2  |
| WL1 | 1  | 4  |
| WL2 | 3  | 6  |
| WL3 | 5  |    |
| WL4 | 7  |    |
| WL5 |    |    |
| ... |    |    |
| WLK |    |    |

|     | LP | UP |
|-----|----|----|
| WL0 | 0  | 1  |
| WL1 | 2  | 3  |
| WL2 | 4  | 5  |
| WL3 | 6  | 7  |
| WL4 |    |    |
| WL5 |    |    |
| ... |    |    |
| WLK |    |    |

| WL0 | 2 |
|-----|---|
|     | 0 |

|     | Segment 1 | Segment 2 | Segment 3 | Segment 4 |
|-----|-----------|-----------|-----------|-----------|
| WL0 | Upper page | Upper page | Upper page | Upper page |
|     | Lower page | Lower page | Lower page | Lower page |

|    | Segment 1 | Segment 2 | Segment 3 | Segment 4 |
|----|-----------|-----------|-----------|-----------|
| UP | 2         | 4         | 6         | 8         |
| LP | 1         | 3         | 5         | 7         |

|    | Segment 1 | Segment 2 | Segment 3 | Segment 4 |
|----|-----------|-----------|-----------|-----------|
| UP | 1,2       | 3, 4      | 5,6       | 7,8       |
| LP |           |           |           |           |

|    | Segment 1 | Segment 2 | Segment 3 | Segment 4 |
|----|-----------|-----------|-----------|-----------|
| UP | 2         | 4         |           |           |
| LP | 1         | 3         |           |           |

SYSTEMS AND METHODS FOR PARTIAL PAGE PROGRAMMING OF MULTI LEVEL CELLS

BACKGROUND

This application relates to the operation of re-programmable nonvolatile memory systems such as semiconductor flash memory systems which record data using charge stored in charge storage elements of memory cells.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

Multiple bits of data (e.g. two) may be programmed together to each cell of a segment of a word line while other segments of the same word line are unprogrammed. Subsequently, additional segments may be similarly programmed. Data may be read from a partially programmed word line (with a mix of programmed and unprogrammed segments) at any time using a single reading scheme. Unprogrammed cells result in blank data which passes error detection. Segmented word lines provide finer granularity when storing data in a memory array and thus provide more efficient use of space in the memory array where small portions of data are stored.

An example of a method of programming a three dimensional Multi Level Cell (MLC) NAND block, includes: programming memory cells of a first segment along a word line in the MLC block to their final programmed logical states, each final programmed logical state of memory cells of the first segment representing two or more bits of a first portion of data; subsequently, while memory cells of the first segment remain in their final programmed logical states, programming memory cells of a second segment along the word line to their final programmed logical states, each final programmed logical state of a memory cell of the second segment representing two or more bits of a second portion of data; and subsequently reading the first portion of data and the second portion of data from the word line.

The memory cells of the first segment may be programmed to their final programmed logical states in a single pass programming operation that programs memory cells to all logical states in parallel. The memory cells of the second segment may be programmed to their final programmed logical states in a single pass programming operation that programs memory cells to all logical states in parallel. The method may include, while the memory cells of the first segment and the second segment remain in their final programmed logical states, programming memory cells of at least a third segment along the word line to their final programmed logical states, each final programmed logical state of a memory cell of the third segment representing two or more bits of a third portion of data. The reading may be performed prior to programming of at least one segment along the word line and the reading may output the first portion of data, the second portion of data, and the third portion of data, and output blank data corresponding to the at least one segment. Data stored in the MLC block may be subject to an Error Correction Code (ECC) scheme prior to storage and the output first, second, and third portions of data, and the output blank data may be correctable by the ECC scheme. Prior to programming the memory cells of the second segment, one or more flags may be set to indicate that the word line is programmed. The one or more flags may be read prior to the reading of the first portion of data and the second portion of data from the word line. Subsequent to setting the one or more flags to indicate that the word line is programmed, no additional flags may be set to indicate further programming along the word line. Each memory cell may have four available memory states and each logical state may represent two bits. Subsequent to programming the memory cells of the second segment, while the memory cells of the first and second segments remain in their final programmed logical states, programming of memory cells of a third segment along the word line may terminate before the memory cells of the third segment reach their final programmed logical states. Subsequently, a read operation may be performed on the word line, the read operation returning a correctable copy of the first portion of data from the first segment, returning a correctable copy of the second portion of data from the second segment, and returning uncorrectable data from the third segment of memory cells. The read operation may return blank data for at least one unwritten segment along the word line, the blank data corresponding to substantially all memory cells of the unwritten segment remaining in an erased state.

An example of a method of programming data along multi-segment word lines of a three dimensional Multi Level Cell (MLC) NAND block, includes: programming memory cells of a first segment along a word line in the MLC block to their final programmed logical states in a single pass, each final programmed logical state representing two or more bits of a first portion of data; subsequently, while the memory cells of the first segment remain in their final programmed logical states, programming memory cells of a second segment along the word line to their final programmed logical states in a single pass, each final programmed logical state representing two or more bits of a second portion of data; subsequently, while the memory cells of the first and second segments remain in their final programmed logical states, programming memory cells of a third segment along the word line to their final programmed logical states, each final programmed logical state representing two or more bits of a third portion of data; and subsequently, while memory cells of at least one segment along the word line remain unprogrammed, performing a read operation along the word line to obtain the first, second, and third portions of data.

The read operation may obtain data from memory cells of all segments along the word line including the unprogrammed segment. Each memory cell may have four available memory states and each logical state may represent two bits. Each memory cell may have eight available memory states and each logical state may represent three bits.

An example of a three dimensional Multi Level Cell (MLC) NAND memory includes: a plurality of nonvolatile memory cells that are programmable into four or more states to store two or more bits per cell; a plurality of word lines that form control gates of the plurality of nonvolatile memory cells; and a write circuit configured to write data to one or more segments of MLC memory cells along a word line in a single pass that brings memory cells from an erased state to all programmed states while at least one segment along the word line remains unwritten.

A read circuit in the memory may be configured to read all segments along the word line in a read operation. One or more read/write flags in the memory may indicate if data is written along the word line. The memory may include an Error Correction Code (ECC) circuit.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6F illustrate examples of programming a population of memory cells.

FIG. 8A shows an example of a physical structure of a 3-D NAND string.

FIG. 8B shows an example of a physical structure of a U-shaped 3-D NAND string.

DETAILED DESCRIPTION

Memory System

Figure 1:
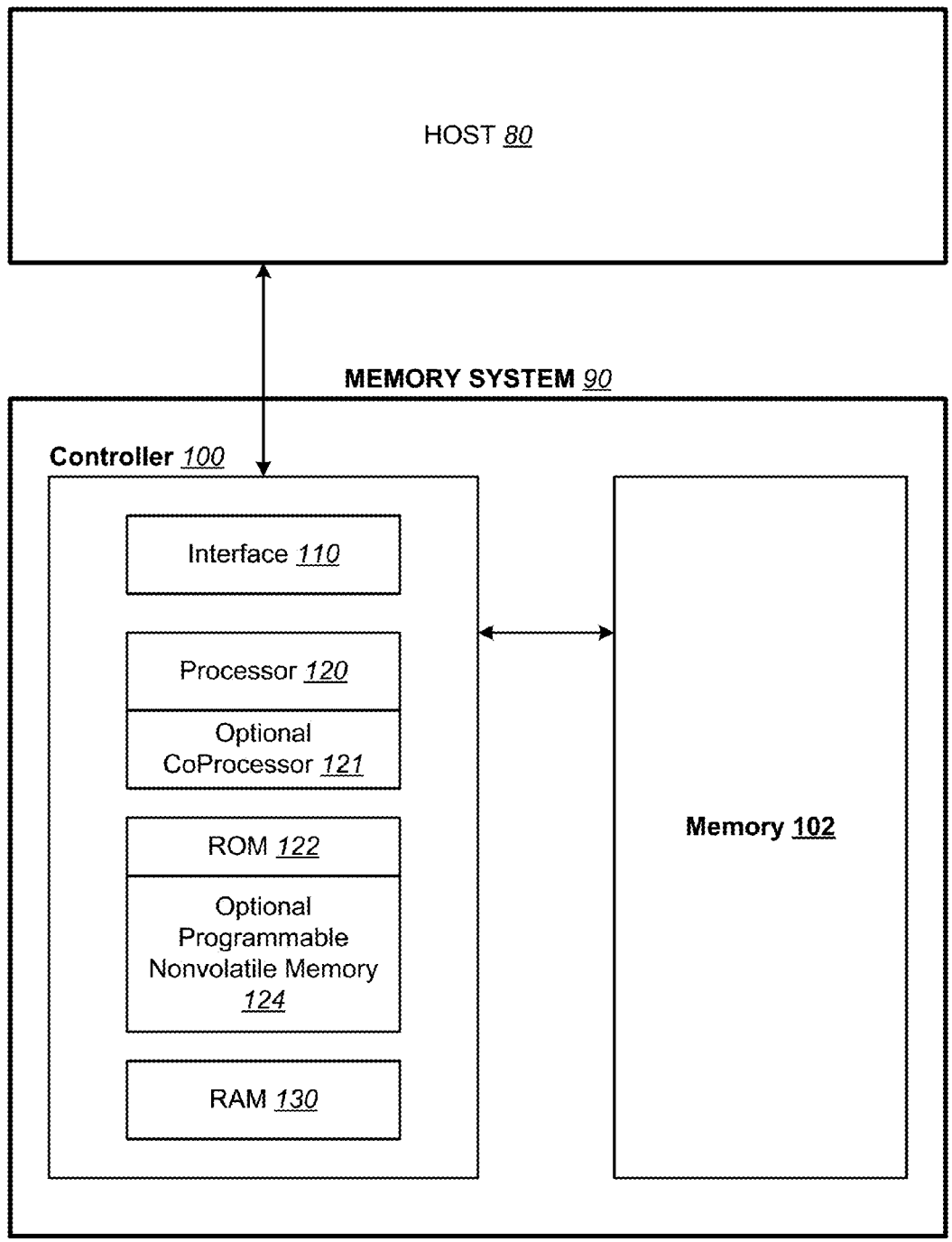
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
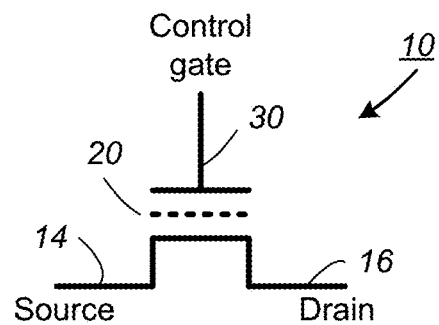
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Figure 3:
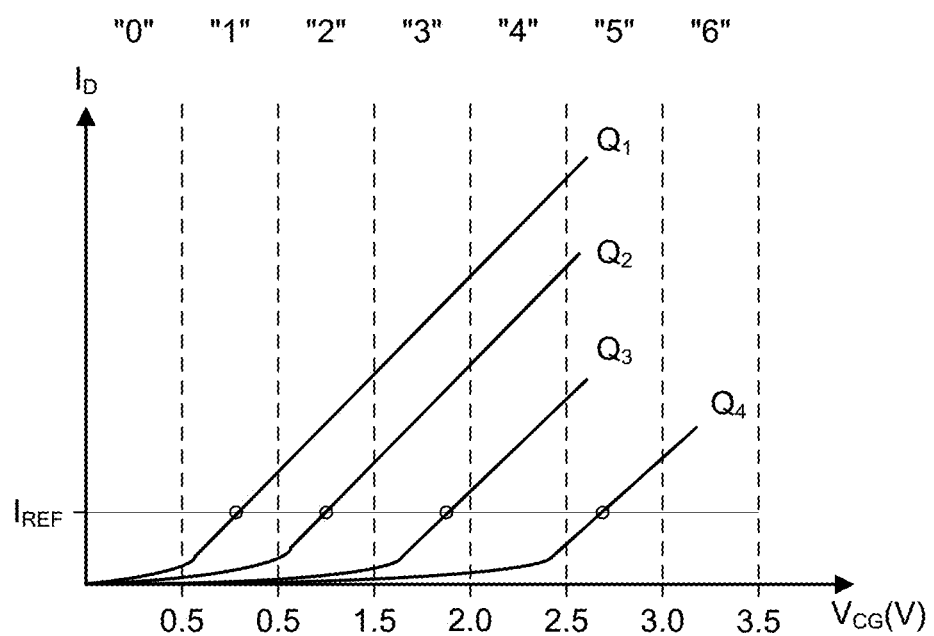
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
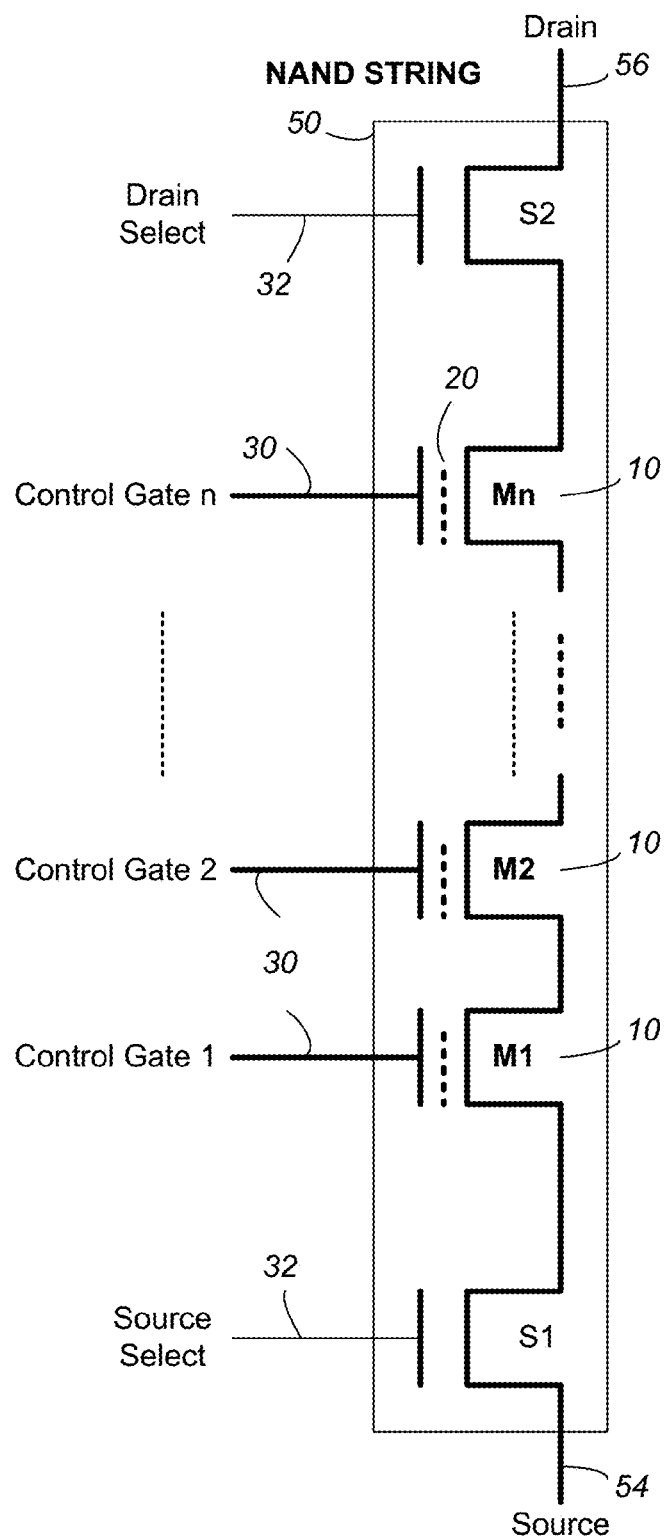
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
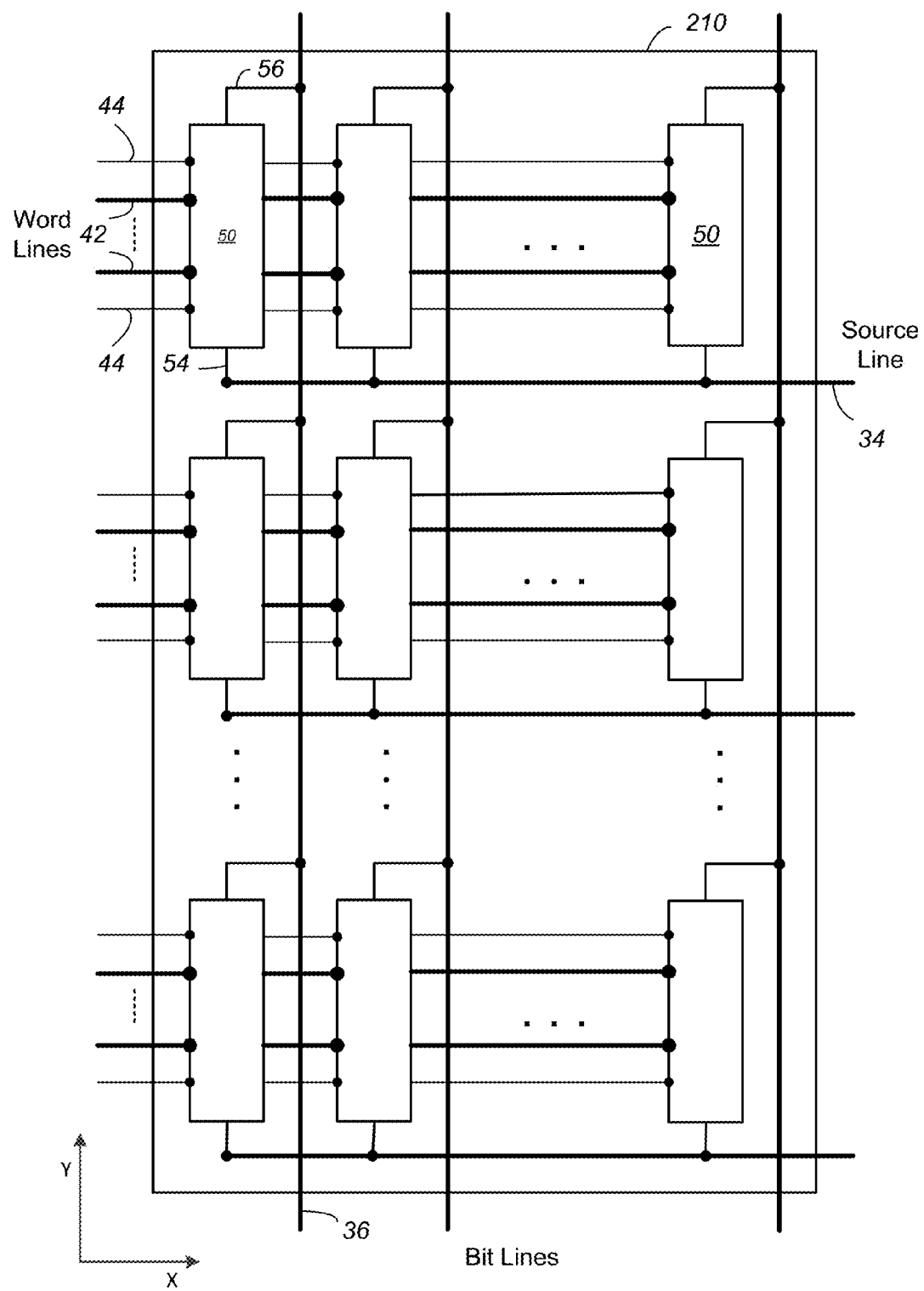
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
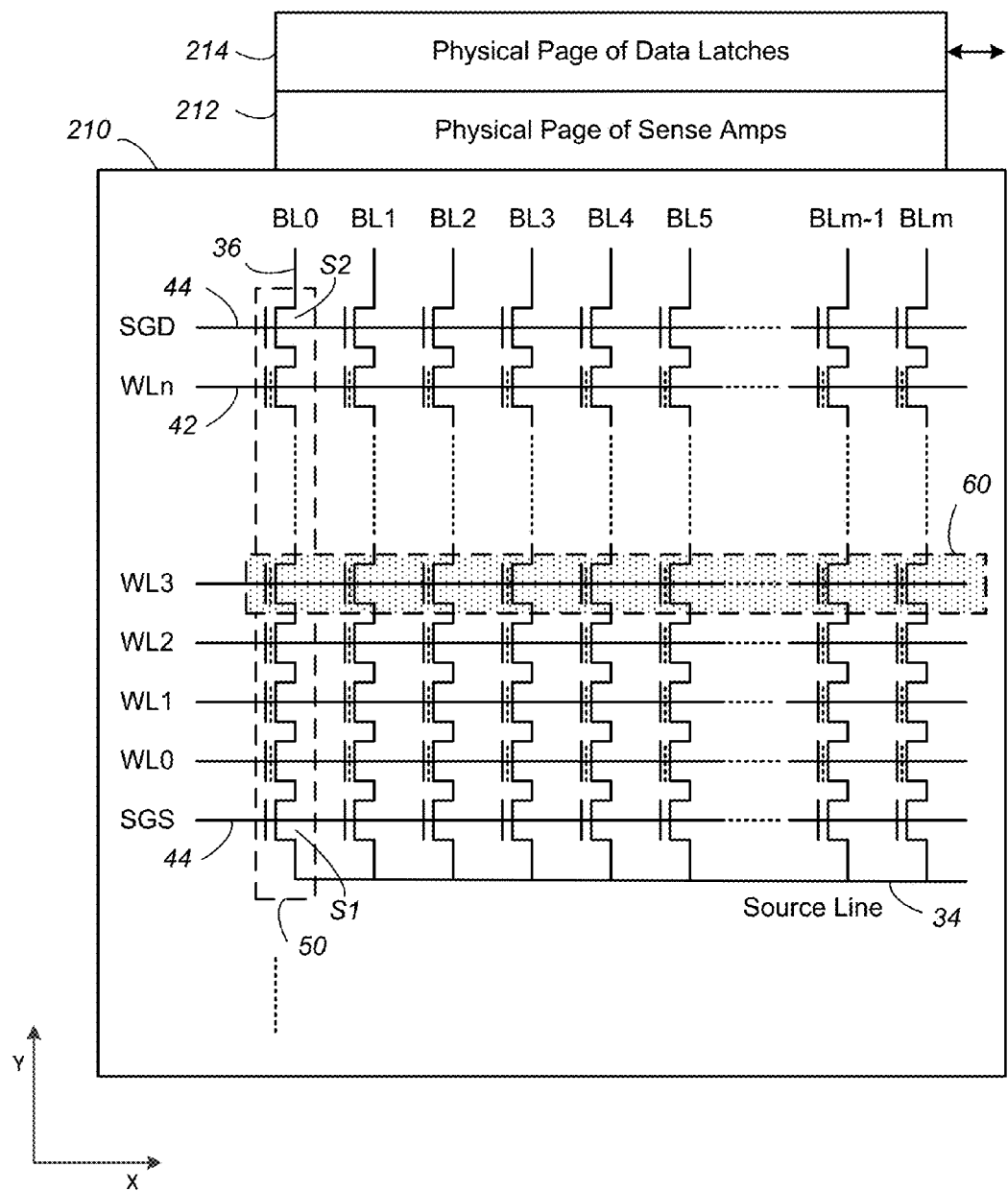
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector may include user data and overhead data.

SLC and MLC Programming

FIG. 6A-6C illustrate an example of a population of 2-state memory cells (Single Level Cells, or "SLC" cells). FIG. 6A illustrates how the population of memory cells are programmable into two distinct distributions of threshold voltages, an erased state, "E" and a programmed state, "P." Memory cells may be read by determining whether their threshold voltages are above or below a read voltage, $rV_1$. FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into a zone demarcated by verify level $vV_1$. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

FIG. 6D-6F illustrate an example of programming a population of 4-state memory cells (MLC cells). It will be understood that memory cells may be configurable as either 2-state or 4 state so that the same memory cells may be SLC at one time and MLC at another time. Typically memory cells are configured as SLC or MLC on a block by block basis so that all cells of a block are operated together as either an SLC block or an MLC block at any given time. FIG. 6D illustrates the population of memory cells programmable into four distinct distributions of threshold voltages respectively representing memory states "E", "A", "B" and "C". FIG. 6E illustrates the initial distribution of "erased" threshold voltages for an erased memory. FIG. 6F illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the erased state. As the memory gets more programming, the initial distribution of the erased state as shown in FIG. 6E will become narrower.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

While the examples above illustrate 2-state SLC operation and 4-state MLC operation, it will be understood that MLC operation is not limited to 4-state examples. For example, eight threshold voltage distributions may be used to store three bits per cell. Other numbers of threshold voltage distributions may be used to store other numbers of bits per cell.

Bit-by-Bit MLC Programming and Reading

Figure 7A:
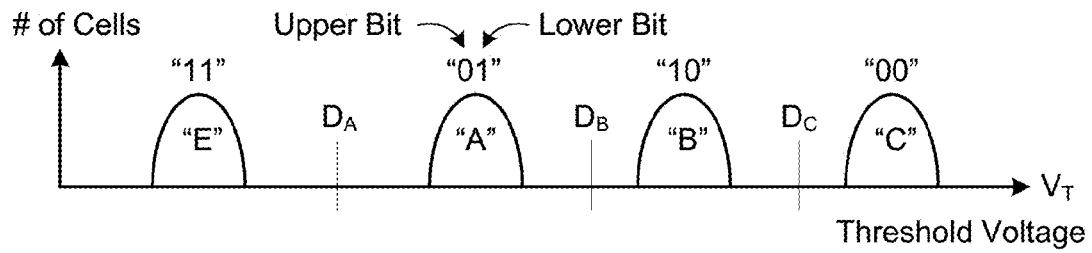
FIGS. 7A-7E illustrate programming of upper and lower page bits in MLC.

FIGS. 7A-7E illustrate the programming and reading of a 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
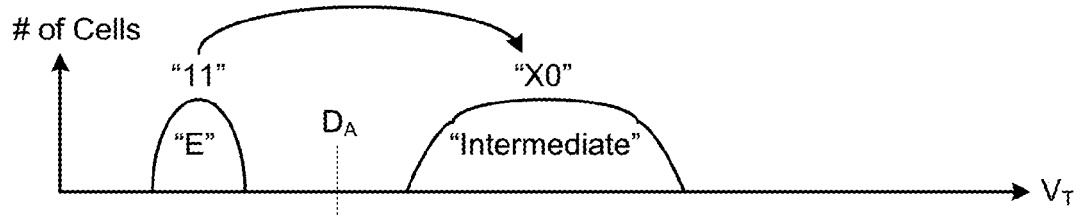

FIG. 7B illustrates the lower page programming (lower bit) in a 2-pass programming scheme using the 2-bit code. The first pass lower page programming has the logical state (upper bit, lower bit)=(1, 1) transits to some intermediate state (x, 0) as represented by programming the "unprogrammed" memory state "E" to the "intermediate" state designated by (x, 0) with a programmed threshold voltage greater than $D_A$ but less than $D_C$. Memory cells programmed with lower page bits only (no upper page bits) may be read using $D_A$.

Figure 7C:
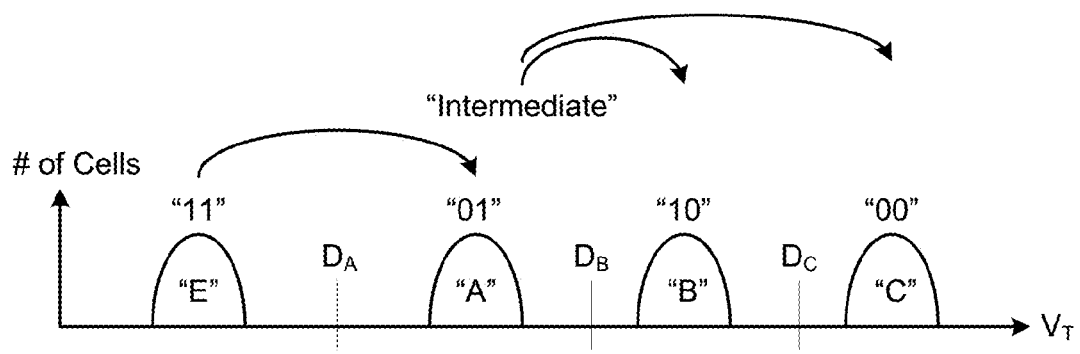

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "E" to "A". If the lower page bit is at "0", the logical state (0, 0) is obtained by programming from the "intermediate" state to "C". Similarly, if the upper page is to remain at "1", while the lower page has been programmed to "0", it will require a transition from the "intermediate" state to (1, 0) as represented by programming the "intermediate" state to "B".

Figure 7D:
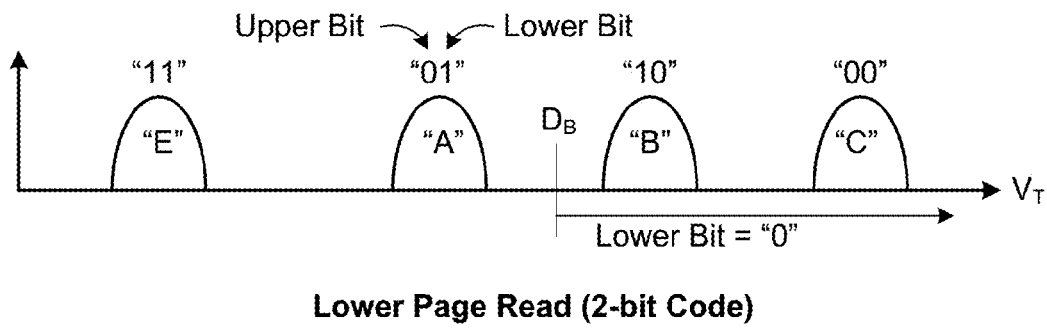

FIG. 7D illustrates the read operation that is required to discern the lower bit of the 4-state memory encoded with the 2-bit code. If the upper page has been programmed then a read operation using $D_B$ will yield the lower page data correctly. On the other hand, if the upper page has not yet been programmed, the lower page data should be read by a read operation using $D_A$.

Figure 7E:
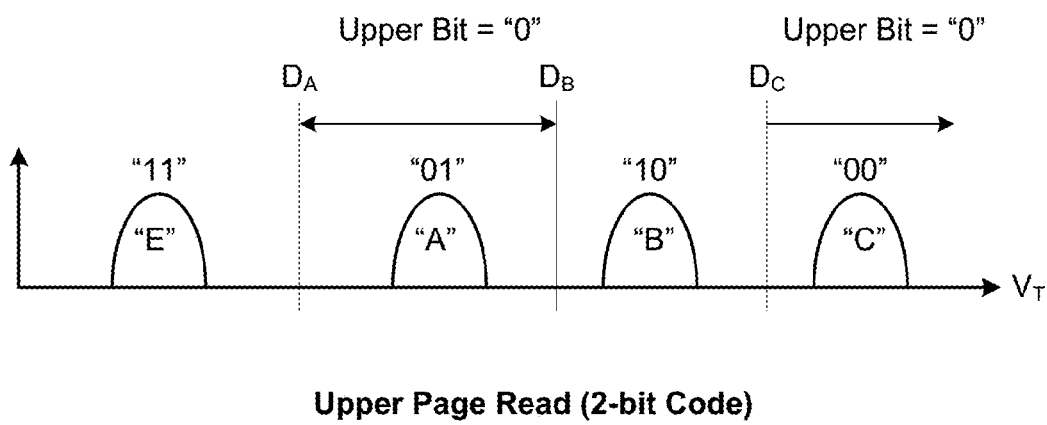

FIG. 7E illustrates the read operation that is required to discern the upper bit of the 4-state memory encoded with the 2-bit code. As is clear from the figure, the upper page read will require a 3-pass read relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page. For example, where memory cells store three bits per cell (using eight states), a physical page of memory cells may store three logical pages, a lower page, a middle page, and an upper page.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

FIG. 8A shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8A shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8B shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
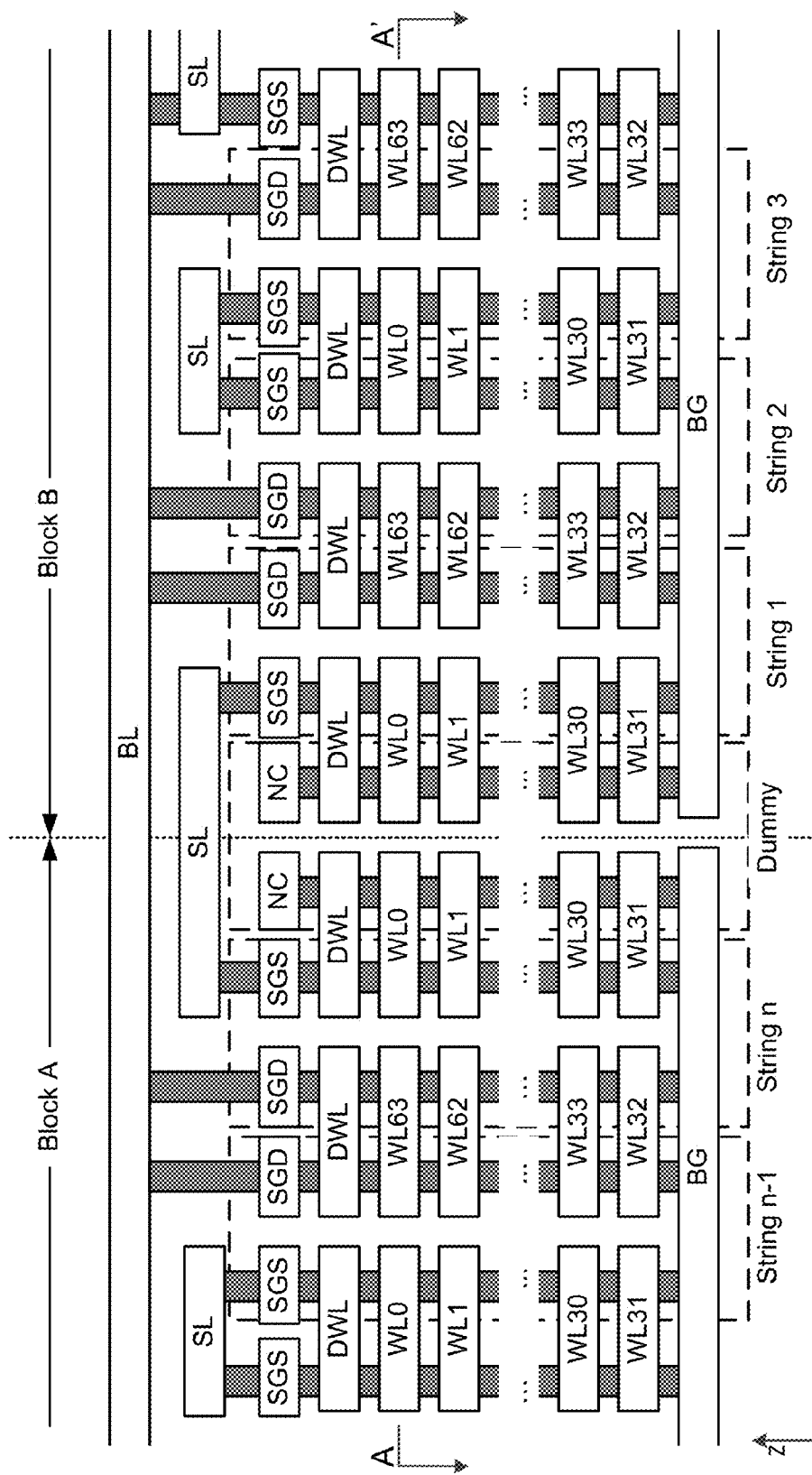
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Figure 9B:
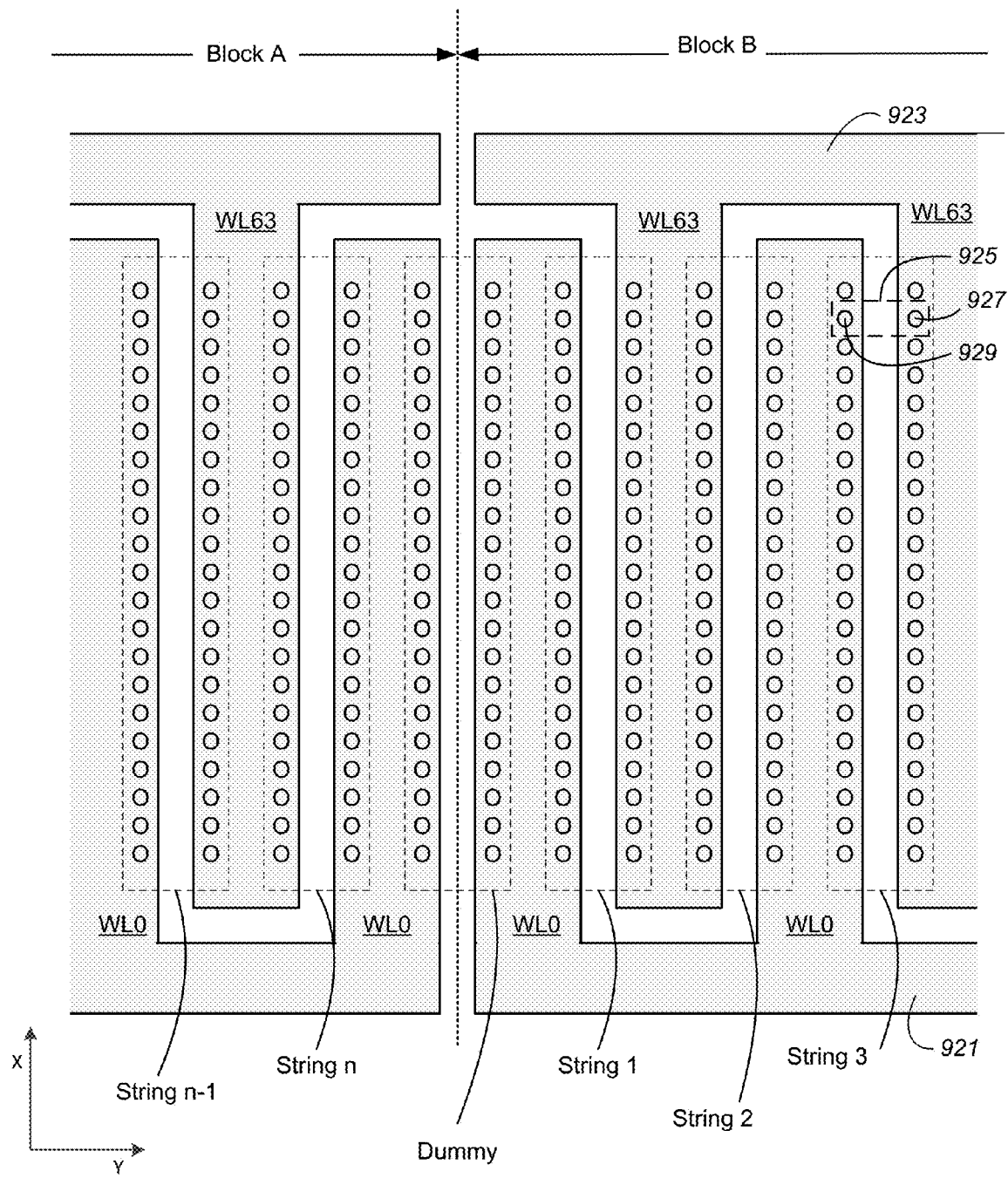
FIG. 9B shows a cross section of the 3-D NAND memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

Programming Order

When memory cells along an MLC word line in a planar NAND array or a three dimensional NAND array are programmed with lower page and upper page data as previously described, cell-to-cell interactions between cells along different word lines may occur and may disturb programmed data. To reduce such disturbance, it is common to choose an order of programming lower page data and upper page data that ensures lower page data of neighboring word lines is programmed before programming upper page data along the word line. Because subsequent programming of neighboring word lines is limited to upper page programming, the disturbance effects are reduced compared with programming both upper and lower pages.

Figures 10, 11, 12A, 12B, 13:
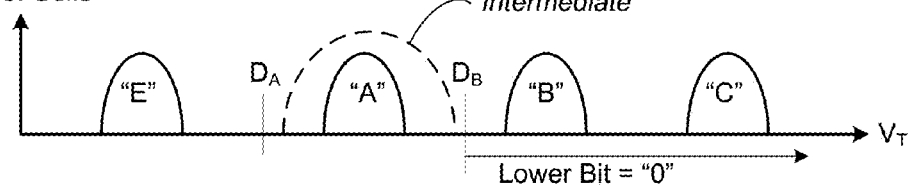
FIG. 10 illustrates an example of MLC word line programming order.
FIG. 11 illustrates another example of MLC word line programming order.
FIG. 12A illustrates an MLC word line that is programmed as a unit.
FIG. 12B illustrates a segmented MLC word line.
FIG. 13 illustrates reading a word line with upper and lower page data.

FIG. 10 shows an example of a word line programming order which ensures that, prior to programming upper page data along a given word line, neighboring word lines are programmed with lower page data. The numbers indicate order and may be logical addresses of sequential data being stored (i.e. logical pages). First, logical page 0 is stored as lower page ("LP") data along word line 0 ("WL0"). Then, logical page 1 is stored as lower page data along word line 1. Only then, with lower page data written along word line 1, is logical page 2 stored as upper page data along word line 0. The order continues with lower page programming preceding upper page programming by a word line as shown.

FIG. 11 shows an another word line programming order in which the data stored in the lower page and the upper page are logically sequential and are stored sequentially, or are stored together in a combined programming operation. A combined programming operation in which lower and upper pages are programmed together may be referred to as Full Sequence Programming ("FSP"). Examples of full sequence programming are described in U.S. patent application Ser. No. 13/788, 415, filed on Mar. 7, 2013, now U.S. Published Application No. 2014/0254263, published Sep. 11, 2014 and Ser. No. 13/933,987, filed on Jul. 2, 2013, which are hereby incorporated by reference in their entirety. While FSP may not be suitable for all memory arrays because of disturbance, or other effects, some memory arrays may successfully be programmed using FSP. In particular, it has been found that some three-dimensional memory arrays (e.g. three dimensional NAND arrays as described earlier) may use FSP successfully.

FIG. 12A illustrates a common scheme in which memory cells along a word line are programmed as a unit with data programmed to all cells in the same program operation. Lower page data and upper page data are separately programmed, at different times, and with other operations between them in this example. Each logical page extends along the entire word line. In FIG. 12A, logical page 0 is programmed as lower page data that extends to all memory cells of WL0 and subsequently logical page 2 is programmed as upper page data that also extends to all memory cells of WL0. This follows the page programming order of FIG. 10. Each logical page is programmed one time as a unit so that there is one lower page programming operation and one upper page programming operation. Even when less than a logical page of data is to be stored, the entire logical page is considered occupied after programming. In some cases, dummy data may be used to fill a logical page when a small amount of data (less than a logical page) is to be stored.

In contrast to FIG. 12A, FIG. 12B shows an example where an MLC word line is programmed in a segmented manner. The word line consists of segments 1-4, each of which contains both upper page data and lower page data. The memory cells along the word line may be divided into physically contiguous segments according to location (e.g. first N/4 cells in segment 1, next N14 cells in segment 2, etc., where N is the number of cells along the word line). In other examples, memory cells of different segments may be interleaved (e.g. every fourth memory cell belongs to segment 1, etc.). Thus, the arrangement of FIG. 12B (contiguous segments) does not necessarily reflect the physical arrangement of memory cells into segments.

Segmenting word lines allows programming of relatively small portions of data (e.g. an ECC word, or small number of ECC words) in a space efficient manner. Segmenting may allow use of larger very large word lines without significant waste because the unit of programming is smaller than the word line. However, segmenting MLC word lines presents certain challenges.

Each segment of an MLC word line may include lower page data and upper page data as shown in FIG. 12B. Using a common programming order as shown in FIG. 10, lower pages of segments 1-4 would be programmed. Subsequently, upper pages of segments 1-4 would be programmed. However, if data is to be read before upper pages of all segments are programmed then the word line may contain some segments with upper and lower pages programmed, and other segments with only lower pages programmed. For example, upper pages of only segments 1 and 2 may be programmed, while upper pages of segments 3 and 4 unprogrammed, with all lower pages programmed. Thus, segments 1 and 2 contain upper and lower page data, while segments 3 and 4 contain only lower page data. This is problematic when data is to be read from the word line.

FIG. 13 illustrates reading of a word line that contains segments that are programmed with upper and lower page data as indicated by distributions E, A, B, and C, and other segments with only lower page data as indicated by distributions E, and "Intermediate" (shown by dashed line). It can be seen that reading such mixed data is not simple. For example, reading lower page data for cells containing lower and upper page data uses read voltage $D_B$, while reading lower page data for cells containing only lower page data uses read voltage $D_A$. Using either read voltage would result in uncorrectable (UECC) data from segments that are not programmed to the corresponding levels (i.e. using $D_A$ would provide UECC data from segments with lower and upper pages programmed, and using $D_B$, would provide UECC data from segments with only lower pages programmed). Thus, no single reading scheme would be adequate to read all data along the word line. Applying multiple reading schemes and decoding the output to try to obtain all stored data would be time consuming.

In some cases, one or more flags are used to indicate whether a word line contains upper page data so that the right read scheme may be applied. Thus, once such a flag is set, any part of the word line that contains only lower page data would result in an error (i.e. reading such lower page only data using an upper/lower reading scheme will provide UECC results).

According to an aspect of the present invention, programming of memory cells along an MLC word line is done in segments, with data of all logical pages in a given segment being programmed together. Thus, instead of first programming lower page data of a segment and at some later time programming upper page data of the segment, both lower page and upper page data are programmed together. Thus, segments are either programmed with both lower and upper page data, or are unprogrammed. No segment is programmed with only lower page data.

Figures 14A, 14B, 15, 16:
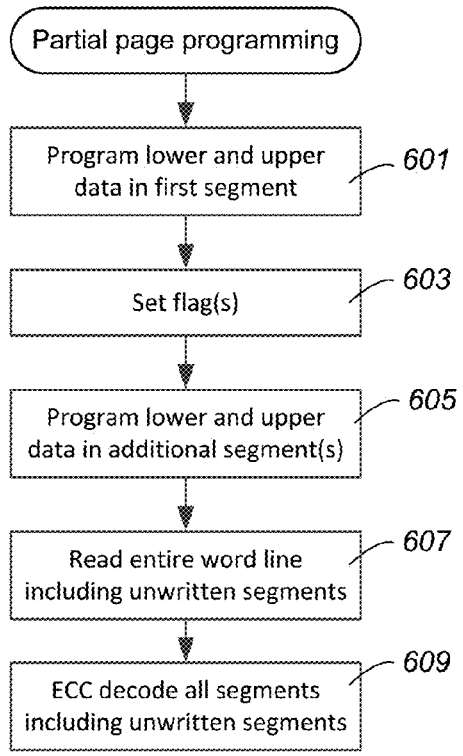
FIG. 14A illustrates an example of data location for a segmented MLC word line.
FIG. 14B illustrates an example of programming order for a segmented MLC word line.
FIG. 15 illustrates an example of a partially programmed MLC word line.
FIG. 16 illustrates an example of partial page programming.

FIG. 14A illustrates how sequential data may be stored in a segmented word line with four segments. Portion 1 and 2 are stored in segment 1, portions 3 and 4 are stored in segment 2 and so on. Lower and upper page data are not separately programmed in this example. Instead they are programmed together in a single pass programming operation. Thus, the programming order is simply: segment 1 (LP and UP), segment 2 (LP and UP), segment 3 (LP and UP), and segment 4 (LP and UP). This programming order is more clearly shown in FIG. 14B which shows a single entry represents upper page and lower page programming of segment 1, and another entry for segment 2, etc.

Individually programming segments along a word line allows a finer granularity when programming than if the entire word line is programmed as a unit. For example, in FIG. 12A, the minimum unit of programming is N bits, where N is the number of memory cells along the word line. N bits may be programmed in a lower page and another N bits may be programmed in an upper page. In contrast, in FIGS. 14A and 14B, the minimum unit of programming is N/2 bits (the number of bits in a segment, including upper page and lower page data). Where a word line is operated in more than four segments the minimum unit of programming may be even smaller.

In general, some disturbance may be expected where multiple programming operations are performed along a word line. For example, data stored in segment 1 may be affected by later programming of segments 2, 3, etc. The more segments there are, the more likely it is that significant disturbance will occur due to the cumulative effects of a large number of programming cycles. These effects may be mitigated by choice of a suitable programming scheme, e.g. relatively small programming pulses. Thus, a suitable number of segments per word line may be selected, along with a compatible programming scheme, based on the susceptibility of the memory array to disturbance.

While a segment may be a minimum unit of programming in a memory, two or more segments may be programmed in parallel when desirable. For example, when large amounts of sequential data are received from a host, all segments along a word line may be programmed in parallel to maximize parallelism and programming speed. When a small fragment of data is to be stored, just one or two segments may be programmed at a time. Thus, the present scheme is adaptive to the amount of data to be stored and reduces the amount of wasted space in the memory array when storing small fragments of data while maintaining high speeds for storing large portions of data.

FIG. 15 illustrates a word line with two segments (segments 1 and 2) that have been programmed and two segments (segments 3 and 4) which are unprogrammed. The programmed segments are programmed with lower and upper page data so that every cell stores two bits of data. No segment contains lower page data only (i.e. no cells contain one bit only). This is ensured by a programming scheme that programs lower page data and upper page data together in a single programming pass. When a read operation is performed on the word line shown, a read scheme is applied that differentiates four states corresponding to two bits per cell (e.g. as shown in FIGS. 7D-7E). Because there are no memory cells with lower page data only, the scenario of FIG. 13 is avoided (no cells in "intermediate" state), and all data along the word line can be resolved using a single read scheme. Unprogrammed segments are read as having all memory cells in the erased "E" state (the "1, 1" state in the examples above). Data corresponding to all memory cells being in the erased condition may be considered blank data. When such data is sent to an ECC decoder the data is correctable (i.e. all bits being logic "1" is an allowed word in the ECC scheme of the examples above) and no ECC fail condition is generated.

If a problem occurs during programming of a segment, or segments, then other segments remain readable, and only the directly affected segment is UECC. For example, if a write abort or an unexpected power loss occurs during programming of segment 2 of FIG. 15, then data in segment 2 may be UECC while data in segment 1 remains correctable and blank data in segments 3 and 4 remains correctable. Thus, a write abort during a particular write operation affects only the data being written, which can generally be recovered from elsewhere. This is in contrast to some MLC programming schemes where a write abort or power loss during programming of upper page data may make lower page data of the same word line UECC.

FIG. 16 illustrates a partial page programming scheme. Lower and upper page data are programmed in a first segment in a single pass programming operation 601. Subsequently, a flag is set that indicates that the word line is programmed 603. Subsequently, additional segments may be similarly programmed with upper and lower data programmed together 605. No further flags are set at this time so that the only flag set in this example is set after the first segment is programmed, before additional segments are programmed. Subsequently, data of the entire word line is read including any unwritten segments 607. The resulting data is subject to ECC decoding 609 where blank data, corresponding to a segment or segments that with all cells unprogrammed, passes ECC decoding. Any segment failing ECC decoding may be an indication of a write abort or power loss and may require suitable action. While read operation 607 is shown after programming of additional segments 605, it will be understood that a word line programmed in segments as described remains readable regardless of how many segments are programmed and how many remain unprogrammed. Thus, a read operation may be performed after just one segment is programmed (after program operation 601 and before program operation 605) or after any number of additional segments are programmed (e.g. after additional segments are programmed subsequent to programming operation 605). In some cases, a word line may remain with a mix of programmed and unprogrammed segments for an extended period. The word line remains readable during such a period.

Figure 17:
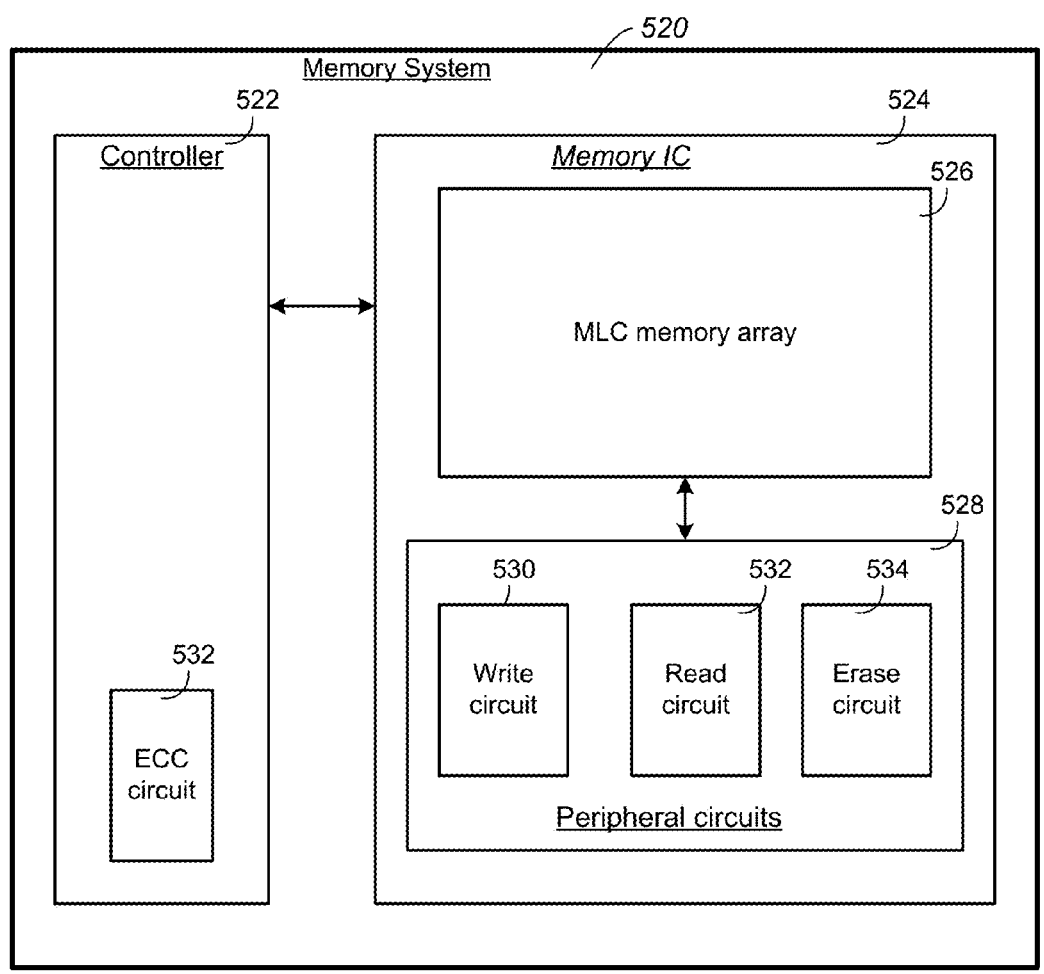
FIG. 17 shows an example of hardware that may be used to implement aspects of the present invention.

FIG. 17 shows an example of hardware that may be used to implement aspects of the present invention. A memory system 520 includes a memory controller 522 and a memory IC 524. The memory IC 524 includes a block-erasable nonvolatile memory array 526 (e.g. planar NAND array, 3-D memory, or other array) which includes MLC blocks in which word lines are configured to be programmable in segments, and in which flags are used to indicate whether a given word line is programmed. The memory IC 524 also has peripheral circuits 528 including a write circuit 530, a read circuit 532, and an erase circuit 534 that are configured respectively write, read, and erase data in memory array 526. Write circuit 530 is configured to program one or more segments along an MLC word line at a time, with all bits in a given segment being programmed in a single program operation. Memory controller 522 includes ECC circuit 532, which is configured to encode data prior to storage and to attempt to decode the data when it is read.

While the above examples are directed to MLC word lines that store two bits per cell, in other memory systems three, four, or more bits may be stored per cell. Programming schemes may program all bits (e.g. three, four, or more) in the cells of a segment in a single programming operation.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of programming a three dimensional Multi Level Cell (MLC) NAND block, comprising:
   programming memory cells of a first segment along a word line in the MLC block to their final programmed logical states, each final programmed logical state of memory cells of the first segment representing two or more bits of a first portion of data;
   subsequently, while memory cells of the first segment remain in their final programmed logical states, programming memory cells of a second segment along the word line from an erased condition to their final programmed logical states in a single pass programming operation that programs memory cells to all logical states in parallel, each final programmed logical state of a memory cell of the second segment representing two or more bits of a second portion of data; and
   subsequently reading the first portion of data and the second portion of data from the word line.

2. The method of claim 1 wherein the memory cells of the first segment are programmed from the erased condition to their final programmed logical states in a single pass programming operation that programs memory cells to all logical states in parallel.

3. The method of claim 1 further comprising, while the memory cells of the first segment and the second segment remain in their final programmed logical states, programming memory cells of at least a third segment along the word line to their final programmed logical states, each final programmed logical state of a memory cell of the third segment representing two or more bits of a third portion of data.

4. The method of claim 3 wherein the reading is performed prior to programming of at least one segment along the word line and wherein the reading outputs the first portion of data, the second portion of data, and the third portion of data, and outputs blank data corresponding to the at least one segment.

5. The method of claim 4 wherein data stored in the MLC block is subject to an Error Correction Code (ECC) scheme prior to storage, and the output first, second, and third portions of data, and the output blank data are correctable by the ECC scheme.

6. The method of claim 1 further comprising, prior to programming the memory cells of the second segment, setting one or more flags to indicate that the word line is programmed.

7. The method of claim 6 further comprising reading the one or more flags prior to the reading of the first portion of data and the second portion of data from the word line.

8. The method of claim 7 wherein subsequent to setting the one or more flags to indicate that the word line is programmed, no additional flags are set to indicate further programming along the word line.

9. The method of claim 1 wherein each memory cell has four available memory states and each logical state represents two bits.

10. The method of claim 1 further comprising, subsequent to programming the memory cells of the second segment, while the memory cells of the first and second segments remain in their final programmed logical states, terminating programming of memory cells of a third segment along the word line before the memory cells of the third segment reach their final programmed logical states.

11. The method of claim 10 further comprising, subsequently, performing a read operation on the word line, the read operation returning a correctable copy of the first portion of data from the first segment, returning a correctable copy of the second portion of data from the second segment, and returning uncorrectable data from the third segment of memory cells.

12. The method of claim 11 wherein the read operation further returns blank data for at least one unwritten segment along the word line, the blank data corresponding to substantially all memory cells of the unwritten segment remaining in an erased state.

13. A method of programming data along multi-segment word lines of a three dimensional Multi Level Cell (MLC) NAND block, comprising:
   programming memory cells of a first segment along a word line in the MLC block to their final programmed logical states in a single pass, each final programmed logical state representing two or more bits of a first portion of data;
   subsequently, while the memory cells of the first segment remain in their final programmed logical states, programming memory cells of a second segment along the word line to their final programmed logical states in a single pass, each final programmed logical state representing two or more bits of a second portion of data;
   subsequently, while the memory cells of the first and second segments remain in their final programmed logical states, programming memory cells of a third segment along the word line to their final programmed logical states, each final programmed logical state representing two or more bits of a third portion of data; and
   subsequently, while memory cells of at least one segment along the word line remain unprogrammed, performing a read operation along the word line to obtain the first, second, and third portions of data.

14. The method of claim 13 wherein the read operation obtains data from memory cells of all segments along the word line including the unprogrammed segment.

15. The method of claim 13 wherein each memory cell has four available memory states and each logical state represents two bits.

16. The method of claim 13 wherein each memory cell has eight available memory states and each logical state represents three bits.

17. A three dimensional Multi Level Cell (MLC) NAND memory comprising:
   a plurality of nonvolatile memory cells that are programmable into four or more states to store two or more bits per cell;
   a plurality of word lines that form control gates of the plurality of nonvolatile memory cells; and
   a write circuit configured to write data to one or more segments of MLC memory cells along a word line in a single pass that brings memory cells from an erased state to all programmed states while at least one segment along the word line remains unwritten.

18. The three dimensional MLC NAND memory of claim 17 further comprising a read circuit that is configured to read all segments along the word line in a read operation.

19. The three dimensional MLC NAND memory of claim 17 further comprising one or more read/write flags to indicate if data is written along the word line.

20. The three dimensional MLC NAND memory of claim 17 further comprising an Error Correction Code (ECC) circuit.

21. The three dimensional MLC NAND memory of claim 17 further comprising a read circuit that is configured to read data from the one or more segments of MLC memory cells along the word line, including the at least one segment along the word line that remains unwritten, and configured to output blank data corresponding to the at least one segment.

* * * * *